United States Patent [19]

Wilson

[11] Patent Number: 5,039,576
[45] Date of Patent: Aug. 13, 1991

[54] ELECTRODEPOSITED EUTECTIC TIN-BISMUTH ALLOY ON A CONDUCTIVE SUBSTRATE

[75] Inventor: Harold P. Wilson, Huron, Ohio

[73] Assignee: Atochem North America, Inc., Philadelphia, Pa.

[21] Appl. No.: 508,993

[22] Filed: Apr. 12, 1990

Related U.S. Application Data

[63] Continuation-in-part of Ser. No. 355,294, May 22, 1989, abandoned, which is a continuation-in-part of Ser. No. 106,656, Oct. 13, 1987, abandoned.

[51] Int. Cl.$^5$ .......................... C25D 3/56; C25D 3/60; C25D 7/00
[52] U.S. Cl. ...................................... 428/626; 204/24; 204/43.1; 204/44.4; 420/562; 420/577; 428/642; 428/646
[58] Field of Search ............... 420/562, 577; 204/43.1, 204/44.4, 26, 24; 428/626, 642, 646

[56] References Cited

U.S. PATENT DOCUMENTS

| | | | |
|---|---|---|---|
| 3,198,877 | 8/1965 | Olson et al. | 420/562 X |
| 3,360,446 | 12/1967 | Jongkind | 204/44.4 |
| 3,663,384 | 5/1972 | Lescure | 204/44.4 |
| 4,252,618 | 2/1981 | Grenda | 204/44.4 |
| 4,331,518 | 5/1982 | Wilson | 204/44.4 |
| 4,565,610 | 1/1986 | Nobel et al. | 204/44.4 |
| 4,717,460 | 1/1988 | Nobel et al. | 204/44.4 |

FOREIGN PATENT DOCUMENTS

| | | |
|---|---|---|
| 22884 | 7/1973 | Japan . |
| 123327 | 10/1978 | Japan . |
| 305208 | 7/1971 | U.S.S.R. . |
| 463747 | 6/1975 | U.S.S.R. . |
| 467145 | 8/1975 | U.S.S.R. . |
| 697610 | 11/1979 | U.S.S.R. . |

Primary Examiner—G. L. Kaplan
Attorney, Agent, or Firm—Stanley A. Marcus; Robert B. Henn

[57] ABSTRACT

An electroplating bath, cell and method for the electrodeposition of a wide range of tin-bismuth alloys onto a conductive substrate comprises tin and bismuth ion in aqueous solution, and an alkyl sulfonic or polysulfonic acid or salt as the electrolyte. The sulfonic component is present in amounts sufficient to maintain the bismuth in solution.

In the operation of the method of the invention, electroplated tin-bismuth eutectic alloys of controlled composition are obtained. The alloys of tin and bismuth contain amounts of both metals such that the plated alloy has a melting point substantially lower than that of either metal alone, and a melting point lower than that of a tin-lead alloy.

8 Claims, 1 Drawing Sheet

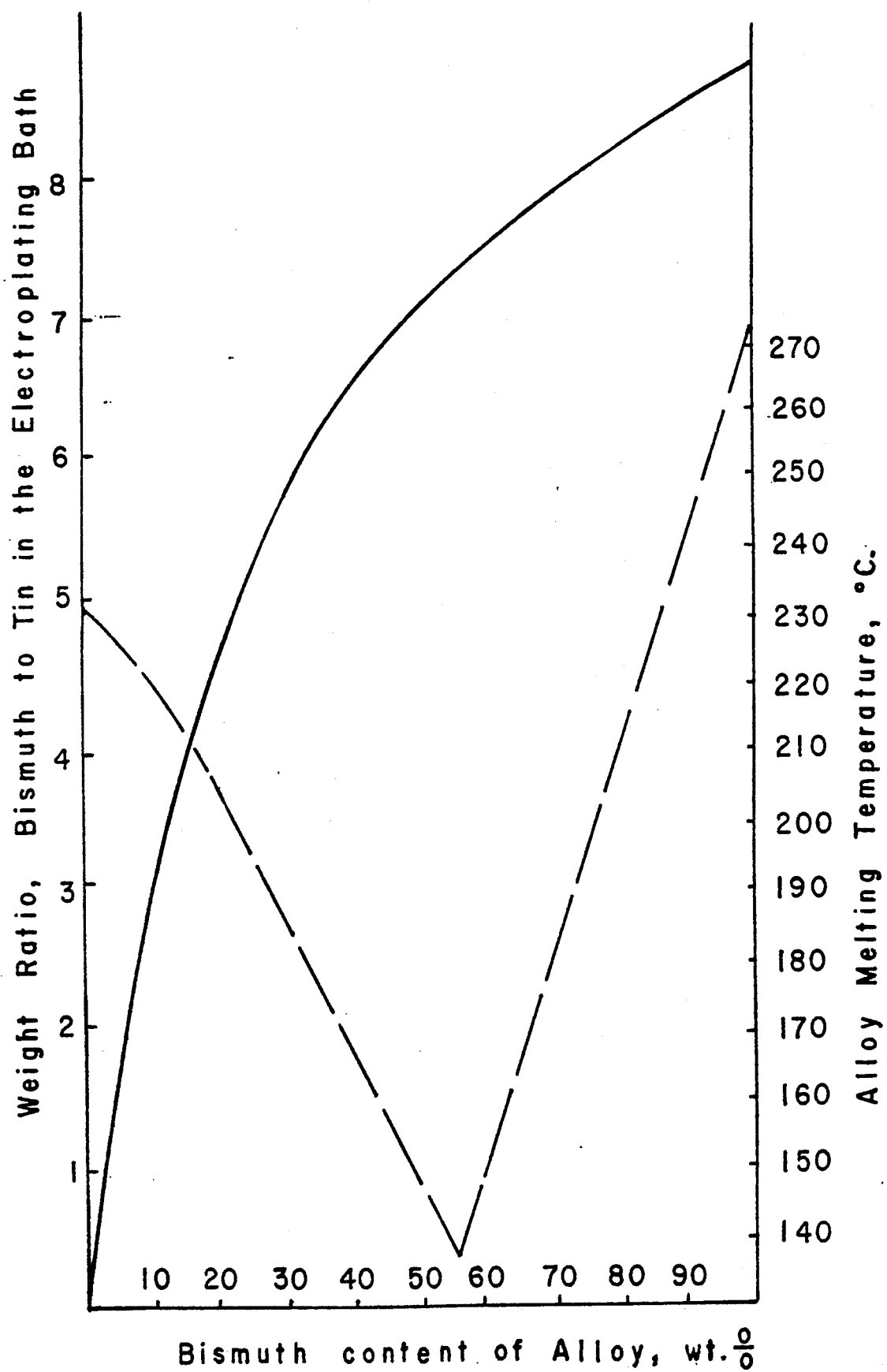

ELECTRODEPOSITED EUTECTIC TIN-BISMUTH ALLOY ON A CONDUCTIVE SUBSTRATE

CROSS-REFERENCE TO RELATED APPLICATIONS

This application is a continuation-in-part of my copending U.S. patent application Ser. No. 355,294, filed May 22, 1989, which was a continuation-in-part of then-copending application Ser. No. 106,656, filed Oct. 13, 1987, both now abandoned.

BACKGROUND OF THE INVENTION

1. Field of the Invention

This invention relates to electrodeposited alloys and particularly to an electrodeposited eutectic tin-bismuth alloy on a conductive substrate.

2. Description of the Prior Art

As printed circuit boards (PCBs) become thicker and more complex, the need to minimize thermal stresses during processing, and the need to obtain completely filled solder holes, become conflicting requirements. In general, more difficult solder requirements are satisfied by increasing the soldering temperature of the board. Unfortunately, however, such an increase also increases the occurrence of board delamination and cracking of the plated "through holes," passages through the PCB for the purpose of emplacing wires or electronic components for carrying current from one face of the board to the other. In addition, rework of the solder on a PCB requires process temperatures and cycle times that increase with board thickness and complexity. Dissolution of the copper plating by molten solder during rework is an added detrimental factor in board survival and reliability.

Such high-melting eutectic tin-lead alloys, typically with compositions around 63 weight percent (wt. %) of tin and 37 wt. % lead, with a melting point around 183 degrees Centigrade (°C.) have conventionally been used both as plated coatings for multilayer circuit-board assemblies and as a eutectic solder for bonding together the layers of tin-lead plated circuit boards. However, tin-lead alloys have not proven entirely satisfactory in some temperature-sensitive applications where heat is undesirable. The temperature required to melt eutectic tin-lead alloy is high enough to damage the components of the PCB, or to impair the conductivity characteristics of the board.

U.S. Pat. Nos. 4,717,460 and 4,565,610, both to Nobel, disclose the use of bismuth in small amounts in plating baths containing tin, lead and sulfonic acids. As little as 0.1 gram per liter (g/l) of bismuth is claimed to improve the low-current-density brightness of the plated tin-lead material if an aromatic aldehyde or alkylene oxide is also present in the bath. However, Nobel does not teach the utility of a tin-bismuth alloy per se.

Bismuth has also been used in combination with tin in electroplating systems. In some electroplating processes, small quantities of bismuth have been added to retard the formation of tin pest and tin whiskers. For these purposes, between about 1 and 2 wt. % of bismuth in the co-plated material, or co-plate, is ordinarily suitable. U.S. Pat. No. 4,331,518 to Wilson discloses an electroplating process which produces tin-bismuth alloys which may have at most not more than about 0.8 wt. % bismuth in the co-plate. Soluble bismuth is provided in the electroplating bath of that patent as a chelated acid bismuth sulfate gluconate.

It has now been discovered that the difficulties of the prior art associated with the use of tin-lead alloys can be overcome substantially, and in some cases completely, by replacing the lead by bismuth. Environmental considerations are also significantly improved by the replacement of lead with bismuth.

SUMMARY OF THE INVENTION

The present invention is an electroplating bath for the electrodeposition of alloys of tin and bismuth on a substrate, and the alloy so obtained. The bath comprises tin and bismuth in aqueous solution, and an alkyl sulfonic or polysulfonic acid or salt as the electrolyte. The sulfonic component is present in amounts sufficient to maintain the bismuth in solution.

In the operation of the method of the present invention, electroplated tin-bismuth eutectic alloys of controlled composition are obtained. The alloys of tin and bismuth contain amounts of both metals such that the plated alloy has a melting point substantially lower than that of either metal alone, and a melting point lower than that of a tin-lead alloy.

In a preferred embodiment, the plated alloy composition is the eutectic mixture of tin and bismuth.

BRIEF DESCRIPTION OF THE DRAWING

The drawing figure is a correlation curve of percent bismuth in the electroplated alloy of this invention as a function of the weight ratio of bismuth to tin in the bath, with a superimposed melting-point curve of bismuth-tin alloys.

DESCRIPTION OF THE PREFERRED EMBODIMENTS

One embodiment of the present invention is an electroplating bath for the electrodeposition of tin-bismuth alloy onto a conductive substrate. The bath comprises bismuth ion in aqueous solution, an alkyl sulfonic or polysulfonic acid electrolyte in an amount sufficient to inhibit hydrolytic precipitation of the bismuth, and tin in aqueous solution, wherein the soluble bismuth and the soluble tin are present in the bath in amounts sufficient to deposit a tin bismuth alloy onto the conductive substrate, the alloy containing those metals in relative amounts such that the melting point of the alloy is substantially depressed relative to the melting point of either metal.

Another embodiment of the present invention is an electroplating cell for electrodeposition of tin-bismuth alloy onto a conductive substrate, where the cell comprises an electroplating bath having bismuth ion in aqueous solution, an alkyl sulfonic or polysulfonic acid or salt as the electrolyte, in an amount sufficient to inhibit hydrolytic precipitation of the soluble bismuth, and tin ion in aqueous solution, the soluble bismuth and the soluble tin being present in the bath in amounts sufficient to deposit a tin-bismuth alloy onto the conductive substrate, the alloy containing tin and bismuth in relative amounts such that the melting point of the alloy is substantially lower than the melting point of either metal alone; an anode immersed in the bath, a conductive substrate cathode immersed in the bath, and an appropriate source of electrical energy for electrodepositing the tin-bismuth alloy onto the conductive substrate. The salt is preferably an alkali or alkaline-earth salt of the chosen sulfonic acid.

The present invention also provides a method for the electrodeposition onto a conductive substrate of a tin-bismuth alloy having a melting point substantially lower than the melting point of either metal alone, wherein the method comprises supplying a plating current to an electrolytic bath in which are immersed an anode and a conductive cathode, under conditions appropriate for electrodeposition of the alloy. The bath comprises bismuth ion in aqueous solution, an alkyl sulfonic or polysulfonic acid or salt as the electrolyte in an amount sufficient to inhibit hydrolytic precipitation of the bismuth, and tin ion in aqueous solution, wherein the soluble bismuth and the soluble tin are present in the bath in amounts sufficient to deposit a tin-bismuth alloy onto the conductive substrate, the alloy containing tin and bismuth in relative amounts such that the melting point of the alloy is substantially lower than the melting point of either metal alone.

The difficulties described with respect to the prior art, and others associated with the use of tin-lead alloys, may be overcome by replacing the lead substantially, and preferably completely, by bismuth. Accordingly, the present invention provides an electroplating bath, cell, and method which comprises the use of alloys of tin and bismuth containing sufficient amounts of both metals such that the plated alloy, or co-plate, has a melting point substantially lower than that of either metal alone. In a preferred embodiment, the plated-alloy composition is the eutectic mixture of tin and bismuth.

It has been discovered that the tin-bismuth alloys of this invention have characteristics that make them attractive replacements for tin-lead alloys for many purposes. For instance, they do not present the health and environmental problems associated with lead-containing alloys. Moreover, a tin-bismuth eutectic alloy has a melting point about 50° C. lower than that of the tin-lead eutectic alloy; this characteristic renders inventive those alloys of varying relative amounts of tin and bismuth which are attractive materials for, e.g., plating, and for soldering layered circuit boards and the like.

The compositions and systems of the present invention differ from those described in the prior-art references in that higher amounts of bismuth are present in baths containing tin and sulfonic-acid derivatives. It is this composition which solves some of the problems associated with the prior-art systems. That is, the baths, systems and alloys of this invention are significantly less risky from environmental and health perspectives, and permit soldering at temperatures substantially lower than those associated with tin-lead alloys of the prior art.

In the present specification, the phrase "tin-bismuth alloy" is generically intended to mean an alloy, or mixture, of greater than about 10 wt. % and less than 100 wt. % bismuth in the electro-deposited alloy, with at least the major part of the balance of the alloy being tin. Further, the alloys of the present invention are those containing tin and bismuth in relative amounts such that the melting point of the alloy is substantially depressed relative to the melting point of either metal. By the term "substantially depressed relative to the melting point of either metal" it is meant that, in reference to the phase diagram for the tin-bismuth system reproduced in the Figure, the melting-point depression of the alloy lies on the curve at a temperature at least about 20° C. below that of the predominant metal. Stated alternatively, the alloys of this invention are those whose melting points are at least about 10° C. lower than the melting point of pure bismuth, 271° C. if that metal is in predominance in the alloy, or at least about 10° C. lower than the melting point of pure tin, 232° C. if the alloy contains a predominant amount of tin.

Accordingly, from standard resources, such as the International Critical Tables, the alloys of interest may be identified from the melting-point phase diagram of tin and bismuth as those containing from about 10 wt. % tin and 90 wt. % bismuth, with a melting point of about 233° C., to those containing from about 90 wt. % tin and about 10 wt. % of bismuth, wherein the alloy has a melting point of about 220° C. Of particular interest to the practice of the present invention are mixtures whose compositions are close to that of the eutectic mixture containing about 58 wt. % tin and 42 wt. % bismuth; that is, compositions whose melting points are within about 25° C. of the melting point of the lowest-melting tin-bismuth eutectic, about 138° C. Electrolytic deposition of the eutectic mixture itself is further within the scope and spirit of the present invention.

It has been found that tin-bismuth alloys having virtually any desired bismuth content may be electroplated onto a conductive substrate from a relatively simple, versatile electroplating bath which includes alkyl sulfonic acid electrolyte in an amount sufficient to prevent hydrolytic precipitation of bismuth. The deposition of alloys having a much wider range of bismuth content than the prior art is possible, in part, from a bath of the present invention because bismuth has been found to be more hydrolytically stable in the presence of alkyl sulfonic acid, particularly methane sulfonic acid (MSA), than in conventional electrolyte solutions used for bismuth, such as those containing sulfuric acid or chloride-citrate mixtures. Using a sufficient amount of alkyl sulfonic acid electrolyte, therefore, is one aspect of the present invention which makes possible the electrodeposition of the desired tin-bismuth alloys.

Aqueous electroplating baths of the present invention, therefore, contain alkyl sulfonic or polysulfonic acids or their salts, depending upon the constituent ingredients of the particular bath, and are typically acidic. Sulfonic acids or their salts can include disulfonic acids, and can be substituted, such as, e.g., chloromethane sulfonic acid, 1,1-difluoroethane-2-sulfonic acid, and the like. Lower-alkyl sulfonic acids are the most preferred acids used in accordance with this invention, and include, without limitation, MSA, ethane and propane sulfonic acids, methane disulfonic acid and 1,1-ethyl and 1,2-ethyl disulfonic acids and substituted disulfonic acids. In this disclosure, where the term "sulfonic acid" is used, it is understood to include polysulfonic and substituted polysulfonic acids or their salts, as appropriate or indicated by context.

To maintain stability of the bath and to prevent hydrolytic precipitation of bismuth from the bath solution, the amount of alkyl sulfonic acid electrolyte in the aqueous acidic electroplating bath ordinarily ranges from about 10 g/l to about 400 g/l, preferably from about 150 to about 300 g/l, and most preferably from about 200 to about 250 g/l. Generally, when the MSA concentration in the plating bath is below about 200 g/l, for example below about 150 g/l, the bath may exhibit undesirable hydrolytic precipitation of bismuth after a period of time. When concentrations of about 200 g/l of MSA are maintained in the bath, hydrolytic precipitation seldom occurs, and the degree of precipitation is very moderate. At a concentration of about 250 g/l of MSA, precipitation of bismuth ordinarily does not occur at observable levels. Thus, a minimum "effective" amount of sulfonic acid, as that term is used herein, is of the range of about 200 g/l of MSA, or equivalent amounts of other sulfonic or polysulfonic acids or their salts; i.e., about 230 g/l of ethane sulfonic acid, about 110 g/l of methane disulfonic acid, etc. Those skilled in the art will understand that somewhat higher amounts of the electrolytes would ordinarily be chosen in order to preclude hydrolytic precipitation of bismuth, rather than the minimum set forth herein, and that mixtures of acids and salts can be used.

Soluble bismuth available to form a tin-bismuth alloy on a conductive substrate may be provided in a bath of the present invention by adding a bismuth salt, preferably a bismuth alkyl sulfonate, directly to the bath; it may also be provided by a soluble bismuth metal anode. Either source of soluble bismuth may be used alone, but they can be, and often are, used together.

For most applications of the present invention, the amount of soluble bismuth in the aqueous acidic plating bath ordinarily ranges from about 0.05 grams of bismuth per liter of the bath to about 150 g/l, and preferably from about 0.05 g/l to about 80 g/l of the bath. Bismuth ion is preferably provided as bismuth tris(methane sulfonate) concentrate, or BTMS, also described as tri(methane sulfonyl) bismuth, $Bi(CH_3SO_3)_3$.

BTMS concentrate can be prepared by reacting bismuth trioxide with 70% methane sulfonic acid. It has been found that a product-bath solution having a concentration of from about 200 to about 225 g/l of BTMS is stable only when there are at least 200 g/l free methane sulfonic acid, i.e., more acid in the solution than stoichiometrically required in order to complex the bismuth ion. As the electroplating process proceeds, additional BTMS concentrate may be added to maintain an adequate soluble bismuth content in the bath.

In one electroplating system of the present invention, a soluble bismuth anode is used to maintain the bismuth in the plating bath so that further additions of BTMS are minimized or not required during operation. The bismuth anode useful in the present invention is constructed of soluble bismuth metal, typically cast, high-purity bismuth. Other components of electrolytic cells, such as the container for the electrolyte solution, are well known to those skilled in the art, and form no part of this invention as such.

When bismuth anodes are used to provide soluble bismuth, the immersion area of the anodes is necessarily regulated in order to control the solubilization rate to meet plating demand and to maintain solution concentration. Bismuth anodes generally produce plated tin-bismuth alloys having clean, gray-white satin finishes.

It has been found that bismuth anodes in a plating bath containing about 250 g/l of free methane sulfonic acid are very active, and tend to increase the bismuth-ion concentration, thereby slowly changing the bismuth-tin ratio in the plated alloy. This can be balanced by adding additional tin to the bath; however, the bismuth-ion build-up is preferably minimized by controlling the immersion area of the bismuth anode in order to provide an anode current density of about 1000 amperes per square decimeter (asd). When chelated bismuth is used in the bath as the source of bismuth ions, it is also possible to substitute tin anodes for the bismuth anodes.

The following chelating compounds are among those which are useful to provide chelated bismuth to the electrolyte bath:

(1) Tetraammonium bismuth dinitrilotriacetate (TBD) chelate (approximately 26 wt. % bismuth in water-soluble transparent crystals).
(2) Diammonium bismuth diethylene triaminepentaacetate (DBDT) chelate (approximately 325 g/l bismuth).
(3) Tris(methane sulfonic acid) BTMS trigluconate (TBTT) chelate complex (approximately 200 g/l bismuth)

The concentrations of these bismuth sources in the bath are calculated in the same manner as described for BTMS, except that the free-acid concentration may be less, i.e., from about 100 to about 150 g/l, preferably about 150 g/l. These chelated compounds at high concentrations, particularly DBDT, tend to saturate and cause a spontaneous breakdown precipitation in the MSA bath. The TBD is the preferred chelate in MSA electrolyte baths of the present invention.

Preparations of the foregoing chelates are set forth hereinbelow.

| TBD Reaction Formulations | |
|---|---|
| Component | Amount |
| Bismuth (Bi) | 20.0 g |
| Bismuth trioxide ($Bi_2O_3$) | 22.2 g |
| Nitrilotriacetic acid (2m/m Bi) | 36.6 g |
| Distilled Water | 200 ml |
| Ammonium hydroxide (29% $NH_3$) | 25 ml |

A slurry of $Bi_2O_3$ and nitrilotriacetic acid is agitated and heated at 80° C. for about one hour. The $NH_4OH$ is added slowly to form a water-clear solution. If crystals appear when the solution is cooled to room temperature, a little distilled water is added to redissolve them. The solution is near saturation at about 200 g/l of bismuth. The pH of the solution should be near 6.8 at 25° C. Any residue is removed by filtration through hardened ashless paper. The filtrate is vacuum-evaporated at about 90 to 100 kiloPascals (kPa) at a temperature below 80° C. to recover the crystals. The crystals are then vacuum-dried at 100 kPa at less than 50° C.

The bismuth content of the crystals is typically 26.4% by analysis. The crystals dissolve readily in water to form clear solutions which are stable at pH values of about 7.0. Solutions at pH values from about 7.5 to about 10 are somewhat unstable; however, increasing pH to greater than 10 restores stability.

| DBDT Reaction Formulation | |
|---|---|
| Component | Amount |
| Bi | 60 g |
| $Bi_2O_3$, 98.5% | 67.9 g |
| Diethylene triaminepentaacetic acid (DTPA), 1 m/m Bi | 116.0 g |
| Distilled or deionized water | 200 ml |
| Ammonium hydroxide (29% $NH_3$) | 39 ml |
| 30% Hydrogen peroxide | 0.5 ml |

Reaction Procedure

The reactor is a 600-milliliter (ml) thick-walled borosilicate glass beaker with an encapsulated magnetic stirrer. A cover glass and a thermometer are provided.

The water is added first, and agitated. The DTPA is then added to form a white slurry. The $NH_4OH$ is added to dissolve the DTPA, and heating is started.

When the solution is practically clear, the $Bi_2O_3$ is added to form a yellow slurry, and the cover glass is put in place. After about 1.5 hours, when the solution temperature reaches about 90° C., the solution has a slight haze at a volume of about 300 ml. The cover glass is then removed to promote evaporation to about 200 ml. The solution is cooled to room temperature and filtered at low vacuum through a glass-fiber filter to yield about 175 ml. of clear yellow filtrate typically having a density of 1.54 g/ml at room temperature, and an analysis of 328 g/l bismuth. The product concentrate generally has a pH at room temperature of at least 6.0.

| TBTT Reaction Formulation | |
|---|---|
| Component | Amount |
| Bi | 20 g |
| $Bi_2O_3$, 98.5% | 22.3 g |
| 50% gluconic acid (3 m/m Bi) | 91.3 ml |
| Distilled or deionized water | 30 ml |
| 70% methane sulfonic acid | 58.1 ml |
| 30% hydrogen peroxide | 0.5 ml |

Reaction Procedure

The reactor is a 250-ml. thick-walled borosilicate glass beaker with a magnetic stirrer. A cover glass and thermometer are provided.

The water is added first, followed by the gluconic acid. The solution is agitated, and heating starts as the $Bi_2O_3$ is added to form a slurry; the slurry is heated at about 94° C. for about three hours. The MSA is then added in increments for another hour, and the temperature allowed to drop to about 85° C. When all of the MSA has been added, the solution becomes a clear dark red. The hydrogen peroxide is added dropwise over another two hours in order to oxidize any bismuthite, to yield about 125 ml of slightly viscous, dark red solution. About 0.5 ml of the product solution is diluted 500:1 with water, and shows no signs of hydrolysis or precipitation. Typically, the product solution analyzes 174 g/l of bismuth with a density of 1.518 g/ml at 25° C.

Soluble tin may be provided in a bath of the present invention by a salt of a tin compound or a soluble tin anode. Either source of tin may be used alone, or they may be used together.

The preferred salts of a tin compound useful in the aqueous acidic electroplating bath of the present invention are tin salts of alkyl sulfonic acids, preferably lower-alkyl sulfonic acids having from one to about five carbon atoms. The most-preferred salt is stannous methane sulfonate.

The preferred amount of a tin salt, in terms of tin content in the bath of the present invention, ranges from about 0.05 to about 80 g. of soluble tin per liter of the bath, preferably from about 0.5 to about 50 g. of soluble tin per liter of the bath. A preferred range of stannous methane sulfonate is from about 0.13 g/l to about 208 g/l, more preferably from about 0.14 g/l to about 104 g/l. These amounts of stannous methane sulfonate provide, respectively, from about 0.05 g. to about 50 g. of soluble tin per liter of bath. Generally, for most commercial purposes, tin-ion concentrations in the bath below about 5 g/l will seldom be practical.

Stannous methane sulfonate is preferably supplied in a concentrate containing about 300 g/l stannous tin and 10-30 g/l of free methane sulfonic acid. Stannous methane sulfonate concentrate may be made by reacting stannous oxide with methane sulfonic acid. The concentrate may also be formed electrolytically, using a tin anode in a membrane cell containing MSA.

As illustrated in the Figure, a correlation curve of percent bismuth in the electroplated alloy as a function of the weight ratio of bismuth to total tin in the bath was derived from analyses of simultaneous samples of plated tin-bismuth alloys and the plating bath over a wide range of alloys from about 10 to about 90 wt. % bismuth. The bismuth content on the cathode panels ranged from 3.38 to 98.48 wt. %. The weight ratio of bismuth to tin in the baths ranged from about 0.30 to about 9.50, and the weight concentration of total tin plus bismuth was from about 27 to about 66.5 g/l. The correlation curve of percent bismuth in the electroplated tin-bismuth alloy as a function of the weight ratio of bismuth to total tin in the bath is based on chemical analyses of samples taken through the above-mentioned ranges.

Plating variables other than soluble bismuth and tin content may be adjusted to provide a particular composition at the desired rate of electrodeposition. For instance, current density can be adjusted to effect the desired average percent bismuth in the plated alloy; making such adjustments is within the ability of a person of ordinary skill in the art.

The illustrated correlation curve is an accurate guide for calculating both concentrations of tin and bismuth for the full range of tin-bismuth alloys and particularly for compositions having from about 10 to about 90 wt. % bismuth in the plated alloy. By taking a vertical line from any point on that curve, the melting point of the resultant alloy may then be determined on the coincident phase diagram.

Optimum bath stability and inhibition of hydrolytic precipitation of bismuth can be achieved when bismuth anodes are used, and tin in the alloy is replaced. By adding acid stannous methane sulfonate concentrate to the bath at appropriate intervals according to the method of the present invention, the minimum methane sulfonic acid concentration ranges from about 200 to about 250 g/l; the preferred concentration is about 250 g/l. The broad range of methane sulfonic acid concentration is from about 100 to about 400 g/l.

Electroplating baths of the present invention can contain conventional amounts of additives such as surfactants, grain refiners, primary and/or secondary brighteners such as modified aromatic aldehydes or ketones and/or modified alkylene oxides or thier analogs. Such materials and their effects are well known to those skilled in the art, and form no part of this invention as such.

Various leveling and brightening systems may result in some alteration of the precise correlation of the percentage of bismuth in the alloy as a function of the weight ratio of bismuth to total tin in the bath or cell. Thus, the use of such materials may result in correlation curves similar in form to that shown in the drawing, but different in curvature and having somewhat different correlation-equation constants. Such alternations, however, may readily be anticipated by and accounted for by those skilled in the art who come to understand the precepts and principles of this invention.

Irrespective of the use of brighteners, leveling agents and the like, the present invention provides a means of depositing an alloy of controlled composition, and therefore melting point, onto a substrate. By use of the correlation curve of the drawing, a simple electrolytic bath of this invention will provide the alloy composition chosen; if various processing additives are used, the composition may vary somewhat from the values given there, but a desired composition can be easily determined by minimal investigation of the effect of such ingredients, and thereafter closely controlled within those parameters.

The conductive substrate or cathode of electroplating cells of the present invention may be any object which is electrically conductive. Frequently, such objects are composed of or include metals such as iron, nickel, stainless steel, zinc, copper, or a combination of conductive substrates, but the spectrum of conductive substrates which may be plated in accordance with the present invention is not limited to the listed metals; any material which is or can be made conductive is within the spirit and scope of the present invention. Such materials include, e.g., precursors to PWBs, including metallized or otherwise treated phenolic, epoxy, or resin-bonded glass-fiber boards and the like. PWBs can further include boards having metallic conductors emplaced thereon, but where the PWB surface itself is neither conductive nor treated over its entire surface to receive a conductive subtrate.

It is further within the spirit and scope of this invention to provide PWBs, precursors, metallic lead-frames, and circuit components plated with an alloy by the method and means disclosed herein. Such components include, without limitation herein, thermistors, capacitors, resistors, and chokes; contacts of and for surface-mounted devices, diodes, triodes, tetrodes and the like; wires, wire looms, coils, harnesses and conductive traces; connector blocks, and conductive pads used in tape-automated bonding; hybrid circuits; and metal-non-metal composite electronic devices.

The anode of electroplating cells of the present invention is preferably a bismuth-metal anode which functions as a source of soluble bismuth. Other anodes of the present invention include tin- and inert-metal anodes.

The ratio of anode area to cathode area must be regulated for the proper anode-current density in order to control the rate of anode solubilization to meet plating requirements, and to prevent buildup of bismuth-ion concentration in the bath. Soluble bismuth build-up upsets the weight ratio of bismuth to tin, thus changing the bismuth content of the plated alloy. For example, as a rough guideline, for 5 wt. % bismuth in the alloy, the ratio of bismuth anode area to cathode area is chosen to be from about 1:7 to about 1:8. For 58 wt. % bismuth, the ratio of bismuth-anode area to cathode area is about 0.5:1. For higher bismuth content, the ratio is about 2:1. Bismuth in the range of from 1 to 2 wt. % in the resultant plated tin-bismuth alloy requires a ratio of bismuth-anode area to cathode area in the range of about 1:10. In that case, better plating performance is obtained if high-grade tin anodes are substituted for bismuth anodes, with bismuth added in concentrates according to plating demand, and the concentration of free acid in the bath lowered in order to control anode activity as appropriate.

In an illustration of the utility of the invention, an aqueous acidic electroplating bath is prepared in a conventional electroplating vessel and circulated vigorously at from about 15 to about 25° C. An anode, preferably soluble bismuth metal, which can be wrapped or bagged in polypropylene, is placed in the bath, and the current turned on. A cathode-current density from about 18 to about 375 asd is maintained. The conductive substrate, with the ratio of the anode area to cathode area adjusted according to the desired bismuth content of the plated tin-bismuth alloy, is then immersed in the aqueous acidic electroplating bath.

The conductive substrate is kept immersed for a time sufficient to deposit a tin-bismuth alloy coating of the desired thicknes and composition upon the substrate. The substrate is subsequently withdrawn from the aqueous acidic eletroplating bath. The bath current is maintained until the conductive substrate has been completely withdrawn, in order to minimize smutting of the plate caused by displacement of bismuth from the solution at high concentration by the substrate. The plated conductive substrate is thereafter washed thoroughly as quickly as possible, to minimize staining.

This invention is further illustrated, but not limited, by the following examples.

Preparation of the Conductive Substrate

Conductive substrates used for the electrodeposition of bismuth in Examples 1 through 4 were steel panels with a 25-cm$^2$ plating area from Hull-cell panels stripped of zinc electrocoat in 1:1 HCl, and activated in 10% methane sulfonic acid at room temperature, being thoroughly washed with dimineralized water after each treatment. The stripped panels were then electroplated to a thickness of from 0.004 to 0.006 mm. of copper in an acid cupric methane sulfonate bath as described in Table 1, before being electroplated with from 0.003 to 0.025 mm. of bismuth. The adhesion of the electro copper plate to the steel panel was substantially improved by a short dip (e.g. 5 to 10 seconds) of the stripped panel in 20 to 50 g/l HNO$_3$ at room temperature, and by thorough washing before activation in 10% methane sulfonic acid.

Table 1 contains a listing of the bath composition for the electroplating of the Hull-cell panels with copper, and Table 2 contains a listing of the plating conditions and solution characteristics for the bath used to plate the panels with copper. Table 3 lists the plating conditions and solution characteristics common throughout Examples 1–4.

TABLE 1

| Component | Concentration, g/l |
|---|---|
| Copper | 25 |
| Methane sulfonic acid | 40 |
| Cupric methane sulfonate concentrate (129 g/l Cu, 11 g/l MSA) | 193.8 ml/l |
| 69.5% MSA (938 g/l 100% MSA) | 40.4 ml/l |

TABLE 2

| Plating conditions: | |
|---|---|
| Temperature | 20–25° C.(room temp.) |
| Agitation | None |
| Anode | Rolled electrolytic copper |
| Ratio, anode area to cathode area | 2:1 |
| Cathode current density, asd | 18–230 |
| Cathode current efficiency | 100% |
| Solution characteristics: | |
| Clarity | Water-clear |
| Color | Slight yellow tint |
| Residue | Practically none |

TABLE 3

| Plating Conditions: |
|---|

TABLE 3-continued

| | |
|---|---|
| Temperature, °C. | 20–25° C. |
| Agitation: | |
| solution circulation | Vigorous |
| cathode reciprocation | Moderate |
| Anodes | Cast high-purity bismuth, bagged with polypropylene |
| Ratio of anode area to cathode area | Adjusted according to the desired percentage of bismuth in the alloy |
| Solution characteristics: | |
| Clarity | Water-clear |
| Color | Slight yellow tint |
| Residue | Practically none |

EXAMPLE 1

The panels electroplated in the electroplating bath of Table 4 resulted in a conductive substrate with an electrodeposited alloy coating comprising 95 wt. % tin and 5 wt. % bismuth.

TABLE 4

| | ml/l | g/l |
|---|---|---|
| Total tin | | 15.0 |
| Stannous methane sulfonate concentrate | | 48.7 |
| Bismuth | | 12.0 |
| Bismuth methane sulfonate concentrate | | 54.4 |
| Methane sulfonic acid | 500 | |
| Finish-treatment additive | 60 | |
| Working range of cathode-current density | | 20–375 asd |
| Cathode current efficiency | | 95+% |

EXAMPLE 2

The panels electroplated in the electroplating bath of Table 5 resulted in a conductive substrate with an electrodeposited alloy comprising 90 wt. % tin and 10 wt. % bismuth.

TABLE 5

| | ml/l | g/l |
|---|---|---|
| Total Tin | | 15.0 |
| Stannous methane sulfonate concentrate | | 48.7 |
| Bismuth | | 24.0 |
| Bismuth Methane Sulfonate Concentrate | | 109.0 |
| Methane sulfonic acid | 500 | |
| Finish-treatment additive | 60 | |
| Working range of cathode-current density | | 20–375 asd |
| Cathode current efficiency | | 95+% |

EXAMPLE 3

The panels electroplated in the electroplating bath of Table 6 resulted in a conductive substrate with an electrodeposited alloy coating comprising 42 wt. % tin and 58 wt. % bismuth. This proportion of bismuth to tin comprises a eutectic coating.

TABLE 6

| | ml/l | g/l |
|---|---|---|
| Total tin | | 7.5 |
| Stannous methane sulfonate concentrate | | 24.4 |
| Bismuth | | 55.0 |
| Bismuth methane sulfonate concentrate | | 275.0 |
| Methane sulfonic acid | 450 | |
| Finish-treatment additive | 40 | |
| Working range of cathode-current density | | 20–190 asd |
| Cathode current efficiency | | 80% |

EXAMPLE 4

The panels electroplated in the electroplating bath of Table 7 resulted in a conductive substrate with an electrodeposited alloy coating comprising 14.5 wt. % tin and 85.5 wt. % bismuth.

TABLE 7

| | ml/l | g/l |
|---|---|---|
| Total tin | | 6.4 |
| Stannous methane sulfonate concentrate | | 20.8 |
| Bismuth | | 49.6 |
| Bismuth methane sulfonate concentrate | | 228.0 |
| Methane sulfonic acid | 450 | |
| Finish-treatment additive | 75.0 | |
| Working range of cathode-current density | | 20–190 asd |
| Cathode current efficiency | | 80% |
| Ratio of anode area to cathode area | | 2:1 |

Alloys which can be made in accordance with the present invention include, without limitation, 42 wt. % tin and 58 wt. % bismuth alloys, a eutectic material having a melting point of about 138° C., approximately 50° C. lower than tin-lead eutectic composition; and 25/75, 16/84 and other tin-bismuth alloys sandwiched in plastic sheets to make, e.g., formable metallized plastic. Other tin-bismuth alloys find utility in many applications previously filled by tin-lead alloys.

Modifications and improvements to the preferred forms of the invention disclosed and described herein may occur to those skilled in the art who come to understand the principles and precepts thereof. Accordingly, the scope of the patent to be issued hereon should not be limited to the particular embodiments of the invention set forth herein, but rather should be limited only by the advance by which the invention has promoted the art.

What is claimed is:

1. An article of manufacture comprising at least one PWB with at least one conductive surface, having a tin-bismuth alloy deposited on at least a portion of the surface, the alloy being deposited from an electroplating bath comprising bismuth and tin ion in aqueous solution, wherein the bismuth and the tin ion are present in the bath in amounts sufficient to deposit the tin-bismuth alloy onto the conductive surface of the PWB in a weight ratio relative to each other selected to provide a controlled bismuth content of the tin-bismuth alloy on the conductive surface of the PWB in an amount of greater than about 10 wt. % bismuth, the bath having an electrolyte comprising at least one alkyl sulfonic acid or salt thereof in an amount sufficient to inhibit hydrolytic precipitation of the bismuth ion.

2. The article of claim 1 wherein the bismuth content is greater than about 20 wt. %.

3. The article of claim 1 wherein the bismuth content is between about 20 and about 80 wt. %.

4. The article of claim 1 wherein the alloy comprises the tin-bismuth eutectic.

5. The article of claim 1 comprising a plurality of PWBs.

6. The article of claim 1 wherein the tin-bismuth alloy is deposited on a plurality of surfaces.

7. An article comprising a PWB and an electrodeposited eutectic tin-bismuth alloy thereon, the alloy having a melting point of about 138° C. and an alloy composition of about 42 wt. % tin and 58 wt. % bismuth.

8. An article according to claim 7 in which the PWB has metallic conductors thereon.

* * * * *